United States Patent [19]
Gaebe et al.

[11] Patent Number: 5,113,404
[45] Date of Patent: May 12, 1992

[54] SILICON-BASED OPTICAL SUBASSEMBLY

[75] Inventors: Carl F. Gaebe, Fleetwood; Xian-Li Yeh, Macungie Township, Lehigh County both of Pa.

[73] Assignee: AT&T Bell Laboratories, Murray Hill, N.J.

[21] Appl. No.: 548,694

[22] Filed: Jul. 5, 1990

[51] Int. Cl.$^5$ .............................................. H01S 3/19
[52] U.S. Cl. ..................................... 372/36; 372/34; 372/50; 357/74; 357/81
[58] Field of Search ..................... 372/36, 34, 50, 43; 357/74, 81

[56] References Cited

U.S. PATENT DOCUMENTS

| | | | |
|---|---|---|---|
| 4,301,429 | 11/1981 | Goldman et al. | 333/22 R |
| 4,546,478 | 10/1985 | Shimizu et al. | 357/81 |
| 4,686,678 | 8/1987 | Ohta et al. | 357/74 |
| 4,761,788 | 8/1988 | Dietrich et al. | 372/36 |
| 4,779,946 | 10/1988 | Pimpinella et al. | 350/96.20 |
| 4,897,711 | 1/1990 | Blonder et al. | 357/74 |
| 4,945,400 | 7/1990 | Blonder et al. | 372/36 |

OTHER PUBLICATIONS

Comerford, "Etched Silicon Structure For Aligning A Photodiode and Optical Fiber", IBM Technical Disclosure Bulletin, vol. 22, No. 7, Dec. 1979, pp. 2935-2936.

Primary Examiner—Georgia Epps
Attorney, Agent, or Firm—Wendy W. Koba

[57] ABSTRACT

A novel optical subassembly arrangement is proposed. The subassembly comprises a silicon-based submount including a plurality of openings for placement of the various optical components utilized to form the optical subassembly. In particular, a silicon wafer is processed (e.g., etched) using conventional techniques to simultaneously form a large number of individual submounts, each submount processed to include a number of openings. The silicon processing may be sufficiently controlled such that active alignment of the components is minimized. An important feature of the design, when associated with an isolated embodiment, is that the silicon submount is formed to include openings for both the laser and isolator optics such that the openings are disposed along a thermal transport path through the silicon substrate from an attached thermoelectric cooler (TEC). Therefore, the laser and isolator optics are maintained at the same operating temperature. In one embodiment, the TEC may be attached to the underside of the substrate so as to form a cantilever arrangement with the substrate. In this embodiment, the isolator's magnet may be disposed to surround the substrate in a manner such that physical contact is avoided. The physical separation between the substrate and the magnet thus frees the TEC from having to unnecessarily cool the magnet.

24 Claims, 5 Drawing Sheets

SILICON-BASED OPTICAL SUBASSEMBLY

BACKGROUND OF THE INVENTION

1. Technical Field

The present invention relates to a silicon-based optical subassembly and, more particularly, to an optical subassembly including a silicon substrate with a plurality of etched openings for positioning of various optical components.

2. Description of the Prior Art

Semiconductor optical devices such as lasers are used in a wide variety of applications, due to their compactness, relatively high efficiency, and well-controlled output. However, a number of requirements are imposed upon these devices. For durability, cooling of the optical device is often necessary, since prolonged high temperature operation can seriously damage and even destroy the device. Further, since the output light intensity from the device is a function of its junction temperature, the supporting structure must be able to efficiently dissipate the heat generated by the high current density in the device in its operating state.

As is well-known in the art of laser packaging, many optical subassemblies utilize a thermoelectric cooler (TEC) to control the laser's operating temperature with respect to the ambient temperature inside the package. In applications which utilize an internal optical isolator, ambient temperature fluctuations have been found to also affect the isolator's optical component (e.g., Faraday rotator material), resulting in changes in the amount of isolation achieved as a function of temperature. The temperature of the isolator optical component may be controlled. However, in these arrangements, the isolator's magnet is usually (unnecessarily) cooled, thus increasing the work required of the thermoelectric cooler and perhaps adversely affecting its performance. The result is a measure of uncertainty in the amount of isolation a package will yield.

Issues regarding the assembly of these semiconductor optical devices with the required lensing and other passive optical components is another area of concern. In most conventional optical subassemblies, the supporting structure may comprise a number of different members. For example, a conventional optical subassembly may utilize one member for the active (e.g., laser) device and a separate member for the passive components. Alignment between the two members is thus required to achieve the desired minimum level of acceptable coupling loss. Alternatively, a single mounting member may be used to hold all the required optical components. In the latter arrangement, each mounting member is individually formed, using precision die-cast piece parts, for example. Additionally, active alignment operations are often required as each component is affixed to the mounting member. As a result, the optical subassembly is often a relatively expensive component of a lightwave transmitter, requiring a relatively long, expensive and tedious assembly process. Further, any modifications in the size, number or arrangement of the optical components often necessitates a redesign of the complete optical subassembly.

Thus, a need remains in the prior art for an optical subassembly which is robust in design, relatively simple to assemble (i.e., requiring few, if any, active alignments), and more amenable to high-volume, low-cost manufacture than those available in the prior art. Further, a need remains for an optical subassembly, including an isolator, which is capable of efficiently controlling the temperature of both the laser and the isolator.

SUMMARY OF THE INVENTION

The needs remaining in the prior art are addressed by the present invention which relates to an optical subassembly and, more particularly, to a silicon-based subassembly including a plurality of etched openings for positioning of various optical components.

In accordance with the teachings of the present invention, a silicon substrate is processed to form a plurality of openings for placement of the required optical components. In one particular embodiment, the silicon substrate is etched to include a first opening for placement of a first (e.g., subassembly-to-fiber coupling) lens, a second opening for placement of isolator optics, and a third opening for placement of a second (e.g., laser-to-isolator coupling) lens. A fourth opening for placement of a laser diode chip carrier may also be included.

During the actual fabrication process, a silicon wafer may be patterned and etched to simultaneously form hundreds of subassemblies. In an alternative embodiment, the second opening (for the isolator) may be eliminated—this design is especially suited for low speed applications where isolation of the laser from the remaining components is not necessary. Alternatively, this second opening may be used to hold other passive optical components, such as a third lens or filter.

It is an advantage of the present invention that the isolator optics are included on the same substrate as the laser such that both components are cooled by the same TEC so as to operate at the same (controlled) temperature. Additionally, the isolator's magnet is thermally separated from the remaining elements forming the optical subassembly. As mentioned above, the cooling of the magnet in prior art designs is not necessary and only serves to increase the cooling load on the TEC. Thermal separation is achieved in accordance with one aspect of the present invention by supporting the silicon substrate in the cantilever arrangement so as to pass through the open core region of the isolator's magnet in a manner such that physical contact between the magnet and substrate is avoided. A support member, attached to the underside of the substrate in the vicinity of the laser, is used to form the cantilever arrangement with the substrate and prevent physical contact between the silicon substrate and the magnet. In one embodiment, the support member is the thermoelectric cooler (TEC) which is advantageously attached to the underside of the silicon substrate in the vicinity of the laser diode and isolator optical component. The use of silicon as the submount material provides for relatively quick transport of temperature changes from the TEC through the substrate to the laser and isolator optics.

Another advantage of the present invention is that the etching process used to form the openings is relatively simple and may be controlled so as to provide the required optical alignment between the various components placed in the openings without the need to perform timely (and costly) active alignments subsequent to assembly.

A further advantage is that the submount (the silicon substrate) may be redesigned merely by changing the masks used to delineate the locations of the various openings.

Various and other advantages of the present invention will become apparent during the course of the following discussion and by reference to the accompanying drawings.

BRIEF DESCRIPTION OF THE DRAWING

Referring to the drawings, where like numerals represent like parts in several views.

DETAILED DESCRIPTION

Throughout the course of the following discussion, the silicon substrate used to hold the various optical components will be referred to as the "submount"; the arrangement including the submount and the various optical components attached thereto will be referred to as the "optical subassembly", or simply, the "subassembly".

Figure 1:
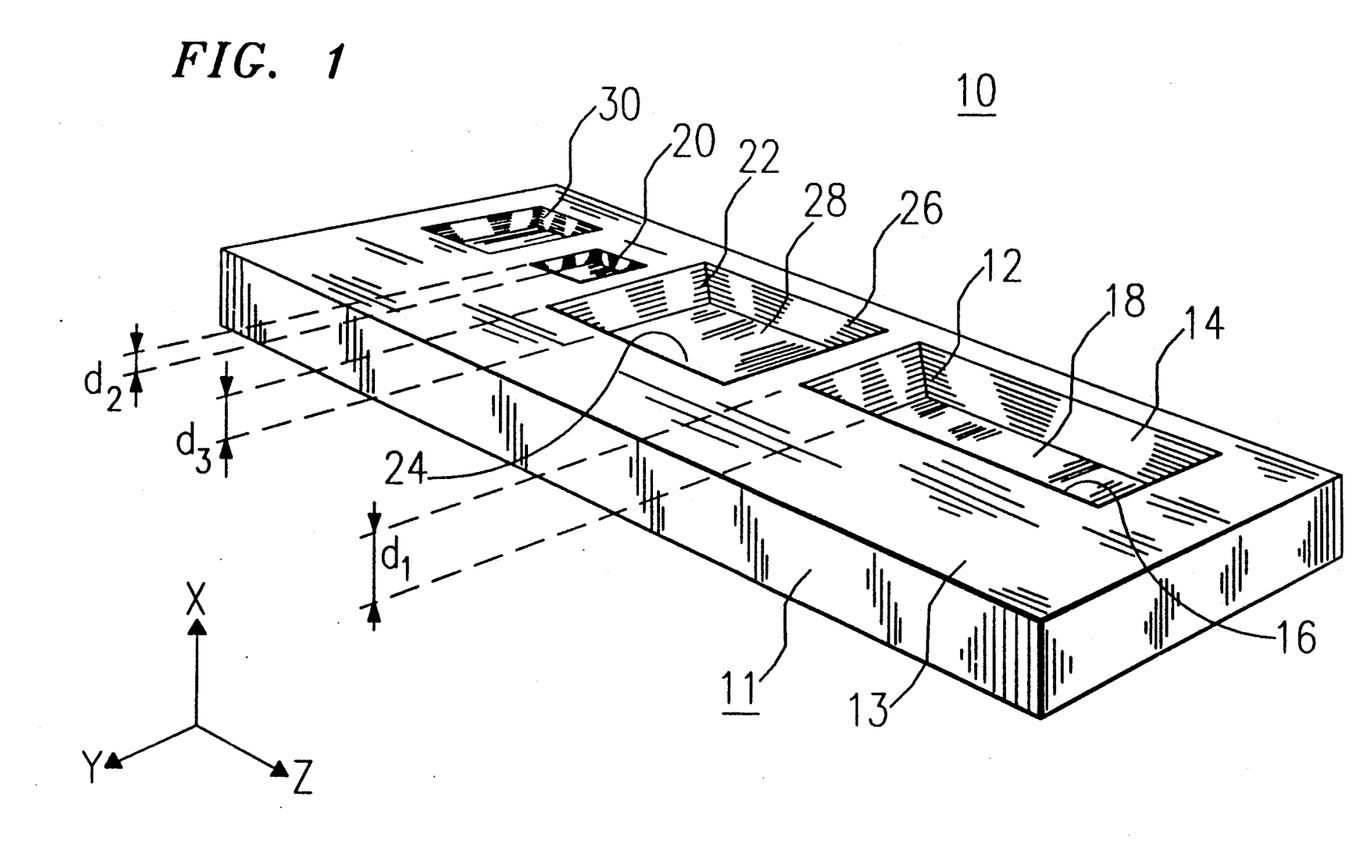
FIG. 1 is a view in perspective of a silicon-based submount formed in accordance with the present invention.
Figure 2:
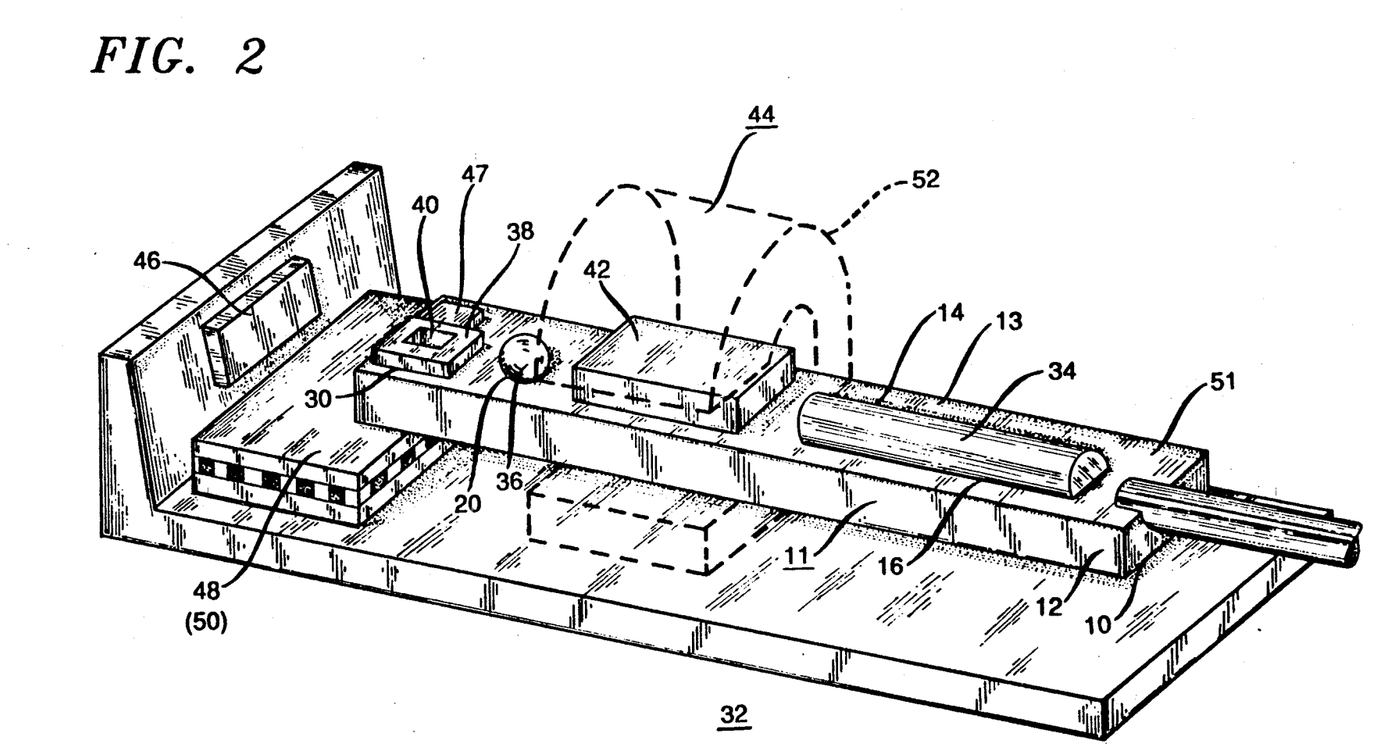
FIG. 2 contains a view in perspective of the submount of FIG. 1, with the various optical components attached thereto so as to form an exemplary silicon-based optical subassembly.

FIG. 1 contains a view in perspective of an exemplary silicon-based optical submount 10 formed in accordance with the present invention. In this particular arrangement, submount 10 comprises a silicon substrate 11 which is processed to include a plurality of openings, formed in top surface 13 thereof, for the placement of a plurality of optical devices. In the exemplary embodiment of FIG. 1, silicon substrate 11 is formed to include a first opening 12 for placement of a first lens. As shown, opening 12 is formed as a rectangular trapezoid, with sidewalls 14,16 which slant inwardly towards a bottom surface 18. Opening 12 is so formed with predetermined dimensions appropriate for placement therein of a cylindrically-shaped graded-index (GRIN) lens (FIG. 2), used to focus the collimated optical signal entering the lens into an external optical communication medium, for example, the core region of an attached optical fiber (FIG. 2). It is to be noted that a square- or spherically-shaped lens would require a different sized opening.

A second opening 20, relatively small and square in form, and also including inwardly tapering sidewalls, is formed in top surface 13 of silicon substrate 11 along the illustrated z-axis in tandem with first opening 12. Opening 20 may be used to hold a second lens, for example, a spherical lens which is used to collimate the optical signal exiting an active optical device (e.g., laser). Second opening 20 is formed to comprise suitable dimensions such that the input beam from the active device will intercept a spherical lens in a manner such that the lens will form a collimated output signal.

A third opening 22 is formed between first opening 12 and second opening 20, along the z-axis of substrate 11 as shown in FIG. 1. Third opening 22 also comprises a rectangular trapezoidal shape, with side faces 24,26 sloping inwardly towards a bottom surface 28. Opening 22 may be used, as shown in later figures, to hold the optical component portion of an optical isolator. As mentioned above, an optical isolator may be used in high bit rate applications where it is desired to prevent any significant reflections from re-entering the laser active region. In this particular embodiment, the physical dimensions of the isolator are somewhat smaller than those of the GRIN lens. Therefore, opening 22 is somewhat smaller than opening 12. As will be discussed in detail below, the relative sizes of the openings may differ, as dictated by the dimensions of the various components contained therein. A fourth, relatively shallow opening 30 may be located behind opening 20. Opening 30 is utilized for placement of the chip carrier holding the active optical device. In an alternative embodiment, the chip carrier may be attached directly to top surface 13 of substrate 11.

FIG. 2 contains a view in perspective of an optical subassembly 32 utilizing the silicon-based submount 10 of FIG. 1. In a typical packaging sequence, a GRIN lens 34 and spherical lens 36 are placed in and attached to openings 12 and 20, respectively, using, for example, a glass solder. Advantageously, the tapered sidewalls of openings 12,20 provide for physical contact for the edges thereof. to silicon substrate 11. A chip carrier 38, holding a pre-bonded laser 40, is next aligned with and soldered to a metal contact deposited in opening 30 (or alternatively, mounted directly on substrate top surface 13). As will be described below, the process of etching the various openings may be sufficiently controlled so as to provide, for example, a $\pm 5$ $\mu$m alignment tolerance between laser 40 and lens 36. Subsequent to the placement of chip carrier 38, the optical component portion 42 of an isolator 44 is attached to opening 22. A backface monitor 46 may be placed as shown in FIG. 2 so as to intercept the light emitted from the rear face of laser 40. The output from backface monitor 46 is coupled to an external monitoring circuit (not shown) which functions to adjust the laser to maintain constant output power by, for example, controlling the laser bias current. A temperature sensor 47 is located in close proximity to laser 40 and optical component 42 so as to monitor the ambient temperature of the packaged arrangement in the vicinity of laser 40 and component 42. The output from sensor 47 is coupled to a thermoelectric cooler (TEC) 48 which functions to regulate the operating temperature of laser 40 and isolator optics component 42, in response to the signal from sensor 47, such that a relatively constant laser/isolator optics temperature is maintained.

As discussed above, an advantage of the arrangement of the present invention is that TEC 48 may be attached to the underside of silicon substrate 11, in proximity to both laser 40 and isolator optics 42. The choice of silicon as the submount material is particularly suited for this aspect, since silicon is known to exhibit excellent thermal transport properties such that any change in the temperature of TEC 48 will be quickly transferred through substrate 11 to laser 40 and isolator optics 42. Alternatively, if the subassembly does not utilize a TEC in this position, a support block 50, for example, another silicon substrate, may be attached to the underside of the optical subassembly in proximity to laser 40.

TEC 48 (or support block 50) is used as shown in FIG. 2 to provide a cantilever arrangement. In particular, the far end 51 of substrate 11 is cantilevered with respect to support block 50. The cantilever design is advantageous in the optical subassembly of the present invention, since the design allows for the permanent magnet portion 52 (shown in phantom) of isolator 44 to be slid over the subassembly and positioned to surround isolator optics 42 without touching silicon substrate 11. Since the two pieces are not in physical contact, any temperature changes of silicon substrate 11 as a result of the operation of TEC 48 (or any other TEC attached to substrate 11) will not be transferred to magnet 52. The thermal isolation between TEC 48 and magnet 52 thus prevents any unnecessary cooling of magnet 52.

Figure 3:
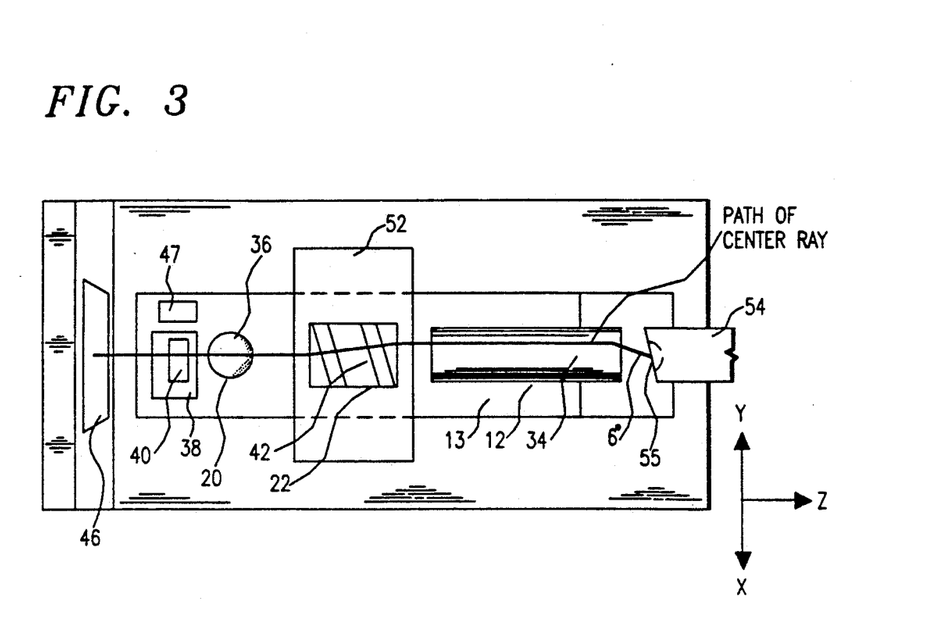
FIG. 3 is a top view of the arrangement of FIG. 2, illustrating in particular the disposition of the optical isolator with respect to the lens components.

FIG. 3 illustrates a top view of optical subassembly 32, showing in particular the positioning of isolator optics 42, permanent magnet 52, and the path of the central ray through the system. The angling of optics 42 relative to opening 20 is evident in this view. In particular, isolator optics 42 may be tilted at a predetermined angle (6°, for example) with respect to the central ray and opening 22. The purpose of the tilt is to achieve improved isolation and is not germane to the present discussion regarding the optical subassembly. Additionally, as shown in FIG. 3, a connecting fiber 54 may contain a beveled endface 55 (formed at an angle of 6°, for example) to further reduce reflections.

Figure 4:
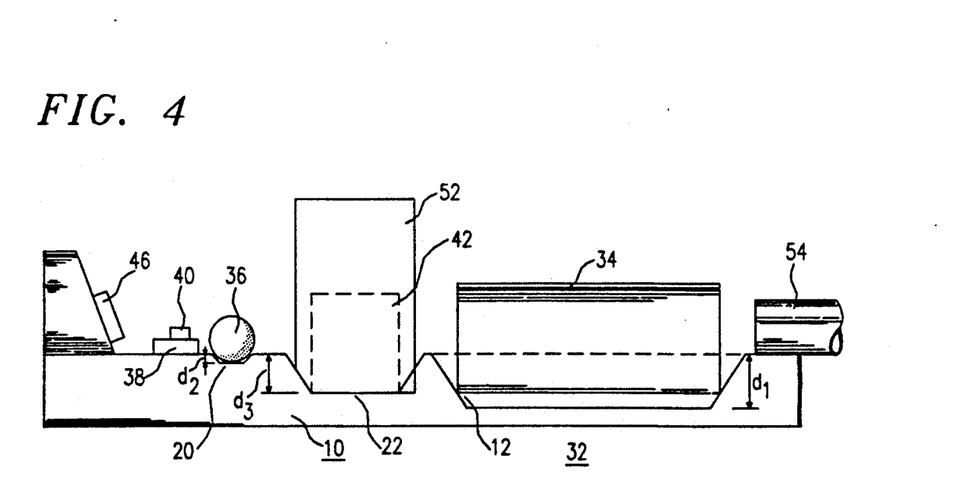
FIG. 4 is a side view of the arrangement of FIG. 2, illustrating the depths of the openings created in the silicon submount for the various optical components.

A cut-away side view of optical subassembly 32 is illustrated in FIG. 4. In this view, the path between the optical components is clearly illustrated, along with the signal path between laser 40 and backface monitor 46. The positioning of each component within its associated opening is clearly visible in this particular view. The alignment of backface monitor 46 with laser 40 is obvious from this view. Further, as shown, it is not necessary that each component rest in the base of each opening, since the physical contact between the component and the opening is in reality provided along the sidewalls of the opening. In FIG. 4, GRIN lens 34 is particularly illustrated as being disposed above bottom surface 18 of opening 12. Therefore, the fabrication process of submount 10 is considered to be somewhat tolerant to fluctuations related to the depths of the various etch processes.

The following discussion is descriptive of an exemplary process for fabricating silicon submount 10 to include the required openings for placement of the various optical components. It is to be understood that although the discussion and associated figures are related to the formation of a single silicon submount, hundreds of such submounts may be formed simultaneously when a silicon wafer is subjected to the fabrication process. Further, the following process steps and/or their sequence are not considered to be unique; various modifications may be utilized to provide a silicon-based submount within the scope of the present invention.

Figure 5:
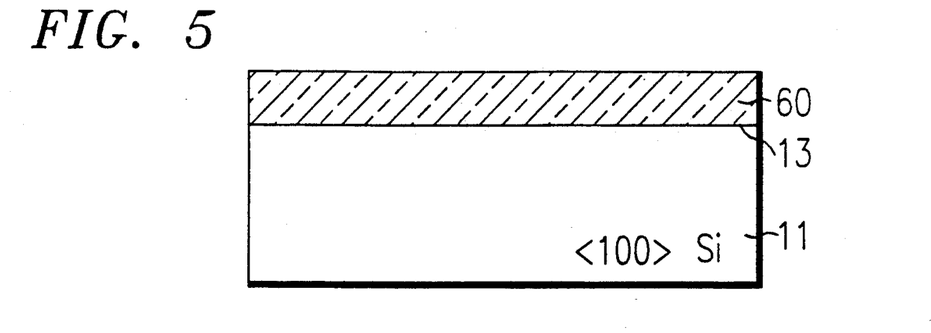
FIGS. 5-8 illustrate an exemplary processing sequence used to form a silicon submount of the present invention.
Figure 6:
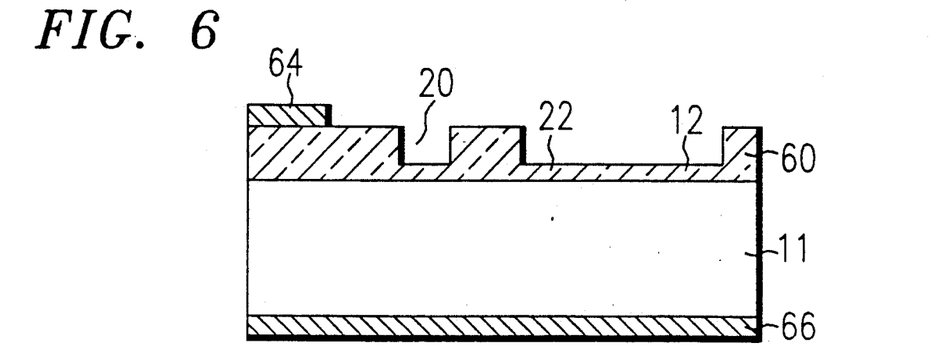

In one exemplary processing sequence, a <100> silicon substrate 11 is provided, where the <100> orientation is utilized so that subsequent etching of top surface 13 will create openings with tapered sidewalls, since the sidewall <111> orientation is known to etch at a relatively slow rate with respect to the etch rate of <100> silicon (ratio of approximately 1:25). As shown in FIG. 5, a relatively thick (for example, approximately 5000 Å) oxide layer 60 is first grown on the top surface 13 of substrate 11. Oxide layer 60 is then patterned (using well-known exposure techniques) to delineate the locations of openings 12, 20 and 28. The exposed oxide is then etched in these areas so as to leave a relatively thin (for example, approximately 1000 Å) oxide layer over surface 13 of substrate 11 at the locations of openings 12, 20 and 22. FIG. 6 illustrates the substrate with an etched oxide layer 60. Metallization 64 required for eventual electrical connection of chip carrier 38, backface monitor 46, and temperature sensor 47 is then deposited over oxide 60 in the appropriate locations, as illustrated in FIG. 6. A second metal layer 66 may then be sputtered on the backside of substrate 11, where metal layer 66 serves as signal ground for the completed subassembly.

Figure 7:
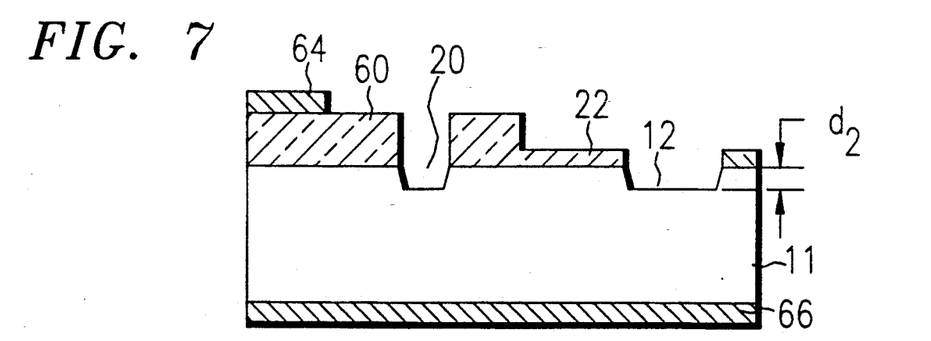

After the metallization process, oxide layer 60 is patterned and etched to expose surface 13 of substrate 11 at the locations for openings 12 and 28. A buffered oxide etch may be used for this purpose. The exposed silicon surface 13 is then etched for a predetermined period of time to provide an opening sufficient for placement of lens 36, as illustrated in FIG. 7. In particular, a depth $d_2$ may be in the range of 100-200 μm. As mentioned above, all depths are meant to be exemplary only, since each design will require various modifications as a function of the dimensions of the optical components.

Figure 8:
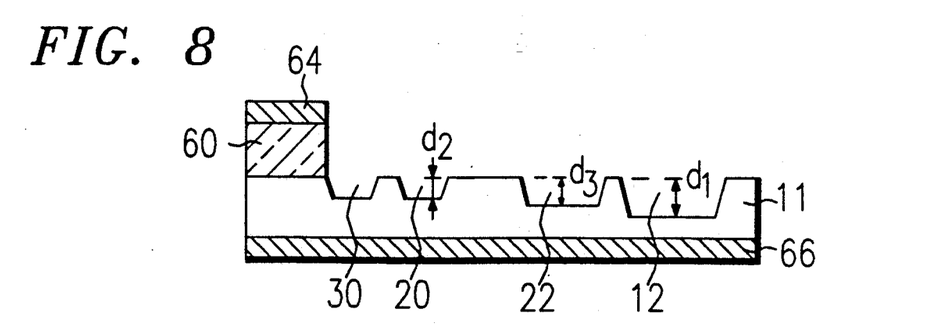

Opening 20 for isolator optics 42 is next formed by first removing oxide layer 60 above silicon surface 13 in the predetermined areas for optics 42. Substrate 11 is then masked to expose only the location of openings 12 and 20. The exposed locations are then etched for a predetermined period of time sufficient to create opening 20 with a depth $d_3$ appropriate for isolator optics 42. In particular, this depth may be in the range of 400-500 μm. As shown in FIG. 8, the second etch in the location of opening 12 results in a depth $d_1$ of approximately $d_2 + d_3$, sufficient for placement of a GRIN lens 34, where $d_1$ may be in the range of 500-700 μm. It is to be noted that depending upon the required sizes, openings 12, 20 and 22 may be created in three separate pattern and etch routines. Additionally, as mentioned above, a fourth opening 30 may be formed behind opening 20 for the placement of chip carrier 38. Opening 30 is relatively shallow, on the order of 10-20 μm. FIG. 8 illustrates a prcessed submount including opening 30.

Figure 9:
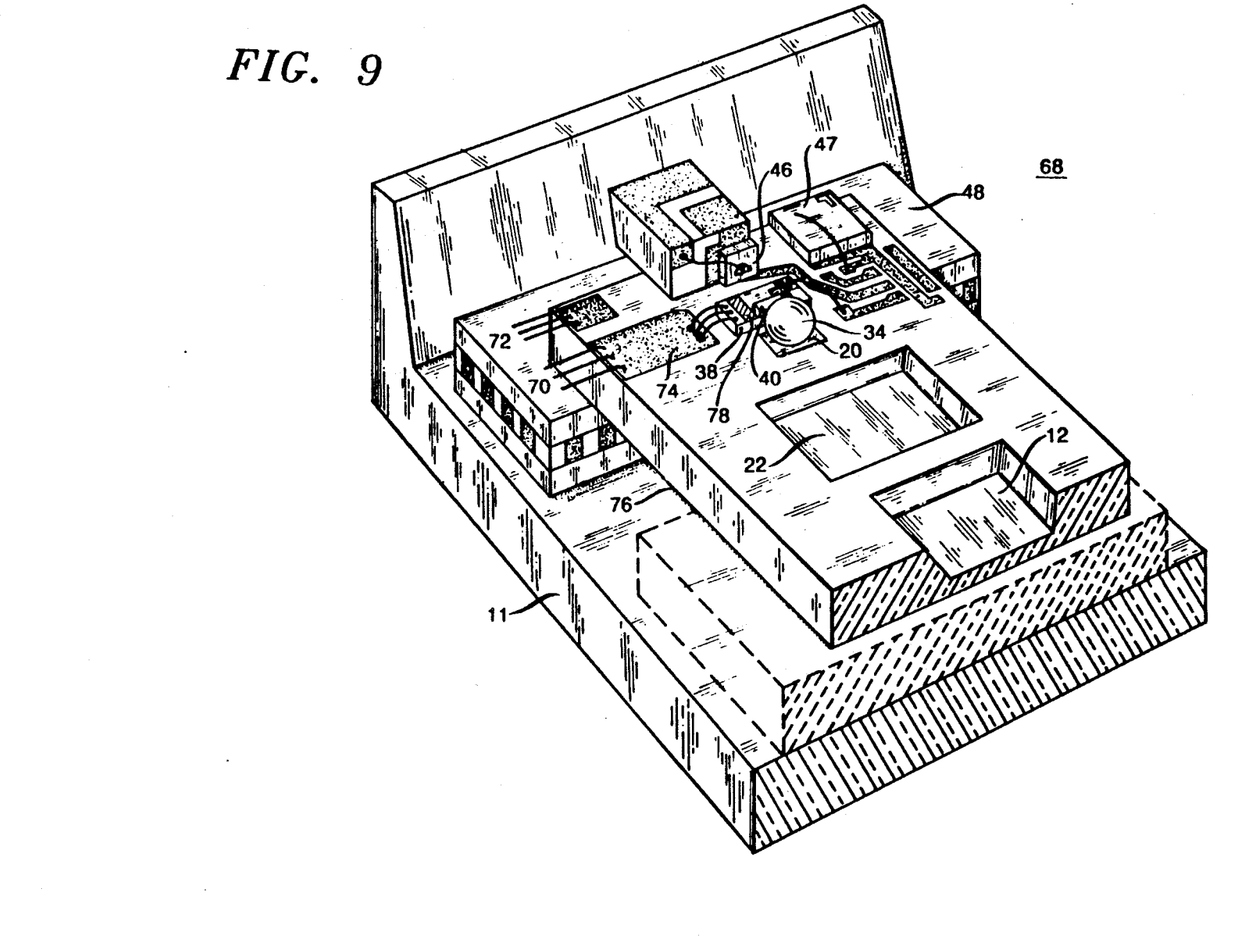
FIG. 9 illustrates an alternative silicon-based optical subassembly formed in accordance with the present invention, including high frequency interconnections to an external signal source.

FIG. 9 illustrates an alternative silicon-based optical subassembly 68 formed in accordance with the present invention. In this embodiment, referred to as a coplanar connection subassembly, the signal ground plane is provided, using vias through the substrate, on top surface 13 of substrate 11. In particular, the high frequency signal connections to laser 40 are provided by a first connection 70 and a second connection 72. Connection 70 is attached to a first metallic strip 74, where strip 74 is subsequently attached to chip carrier 38. Second connection 72 is coupled by a series of vias (not shown) to a second metallic strip 76 disposed on the underside of substrate 11 (illustrated in phantom in FIG. 9). First metallic strip 74, silicon substrate 11 and second metallic strip 76 form a stripline to provide a high frequency interconnection between an external signal source (not shown) and laser 40. A thin film resistor 78 is located on chip carrier 38 in proximity to laser 40 to provide impedance matching of the laser to the stripline. A through description of an exemplary silicon-based high-frequency interconnection may be found in Ser. No. 287,778, filed Dec. 21, 1988, entitled "Silicon-Based Mounting Structure for Semiconductor Optical Devices", and assigned to the assignee of the present invention. As disclosed therein, a silicon substrate is processed to include a via in proximity to the laser so as to provide for attachment of the underlying metallic strip to the top-side laser contact. The use of such a via connection, in conjunction with the impedance matching resistor, provides for a relatively robust high frequency connection at data rates exceeding 2 Gb/s.

It is to be noted that there exist various modifications to the silicon-based optical subassembly which are considered to fall within the scope of the present invention. For example, various optical filters, such as wavelength-selective filters or dichroic filters may be placed in silicon submount openings and optically aligned with the associated active device(s). Further, a single submount could be formed to include an array structure of active devices, with the necessary passive components appropriately disposed in the silicon submount. Alternatively, an optical subassembly of the present invention could be configured as a optical transceiver subassembly including an optical transmitting device, an optical receiving device and the required lensing and filtering components.

We claim:

1. An optical subassembly comprising:
a plurality of optical devices;
a silicon substrate defined as including a major top surface, said silicon substrate including a plurality of openings formed in the top surface thereof, the plurality of openings for placement of said plurality of optical devices and disposed so as to provide optical alignment therebetween; and
a support member disposed with respect to said silicon substrate so as to form a cantilever arrangement therewith.

2. An optical subassembly as defined in claim 1 wherein the plurality of optical devices includes at least one active optical device.

3. An optical subassembly as defined in claim 2 wherein the at least one active optical device comprises a laser.

4. An optical subassembly as defined in claim 2 wherein the at least one active optical device is placed within an opening in the silicon substrate top surface in proximity to the support member.

5. An optical subassembly as defined in claim 2 wherein the plurality of optical devices further includes an optical isolator.

6. An optical subassembly as defined in claim 5 wherein the optical isolator comprises
an isolator optical component placed within an opening in the silicon substrate top surface so as to be in optical alignment with the active optical device; and
a permanent magnet disposed to surround the isolator optical component in a manner such that physical contact with the silicon substrate is avoided.

7. An optical subassembly as defined in claim 2 wherein the plurality of optical devices further includes at least one passive optical component.

8. An optical subassembly as defined in claim 7 wherein the at least one passive optical component comprises
a first lens for coupling an optical signal exiting the optical subassembly to an external optical communication medium; and
a second lens coupled to the active optical device for collimating the optical output therefrom.

9. An optical subassembly as defined in claim 8 wherein the external optical communication medium comprises an optical fiber.

10. An optical subassembly as defined in claim 8 wherein
the first lens comprises a graded index lens of cylindrical shape for transforming a collimated input beam into a focused output beam; and
the second lens comprises a spherical lens for collimating the optical input signal applied thereto.

11. An optical subassembly as defined in claim 10 wherein the silicon substrate includes
a first opening for the first lens, said first opening comprising a relatively trapezoidal shape of a depth $d_1$; and
a second opening for the second lens, said second opening comprising a relatively square pyramidal shape of a depth $d_2$.

12. An optical subassembly as defined in claim 11 wherein depth $d_1$ is within the range of approximately 500–700 $\mu$m, and depth $d_2$ is within the range of approximately 100–200 $\mu$m.

13. An optical subassembly as defined in claim 2 wherein the support member comprises a thermoelectric cooler.

14. An optical subassembly as defined in claim 13 wherein the thermoelectric cooler is disposed with respect to the silicon substrate so as to provide a thermal transport path through said silicon substrate to the active optical device.

15. An optical subassembly as defined in claim 14 wherein the plurality of optical devices further comprises an optical isolator including an isolator optical component placed within an opening in the silicon substrate top surface and disposed along the thermal transport path from the thermoelectric cooler and said silicon substrate.

16. An optical subassembly as defined in claim 2 wherein the at least one active optical device is disposed on an optical chip carrier, said optical chip carrier being attached to the top surface of said silicon substrate.

17. An optical subassembly as defined in claim 16 wherein the chip carrier is attached within an opening formed within the top surface of the silicon substrate, the depth of the opening such that active region of optical device remains disposed above the top surface of said silicon substrate.

18. An optical subassembly as defined in claim 2 wherein the at least one active device further comprises as a second active device a backface monitor positioned to intercept the optical signal exiting the rear face of the first active device.

19. An optical subassembly as defined in claim 1 wherein the silicon substrate comprises <100> oriented silicon such that the plurality of openings include inwardly tapering sidewalls of <111> orientation.

20. An optical subassembly comprising
an active semiconductor optical device;
isolating means for preventing reflected signals from re-entering said active semiconductor optical device;
a first lens disposed after said isolating means for focusing the output from said isolating means into a coupled optical waveguiding medium;
a second lens disposed between said active device and said isolating means for collimating the output from said active device into the input of said isolating means; and
a silicon substrate including a plurality of openings formed in the top surface thereof for placement of said isolating means and said first and second lenses, the plurality of openings disposed so as to provide optical alignment therebetween.

21. An optical subassembly as defined in claim 20 wherein the isolating means comprises an isolator optical component placed in an opening in the silicon substrate; and a permanent magnet disposed to surround said silicon substrate in the vicinity of said isolator optical components;

the subassembly further comprising support means attached to the underside of the silicon substrate in a manner to provide a cantilever optical subassembly arrangement wherein physical contact between said permanent magnet and said silicon substrate is avoided.

22. An optical subassembly as defined in claim 21 wherein the support means comprises a thermoelectric cooler attached to the underside of the silicon substrate in the vicinity of the active semiconductor optical device and the isolator optical component.

23. An optical subassembly as defined in claim 20 wherein the first lens comprises a cylindrical GRIN lens, placed in a relatively rectangular pyramidal opening in said silicon substrate; and the second lens comprises a spherical lens, placed in a relatively square pyramidal opening in the silicon substrate.

24. An optical subassembly as defined in claim 20 wherein the silicon substrate is formed to include an opening for placement of a active device chip carrier.

* * * * *